(12) United States Patent
Wong et al.

(10) Patent No.: US 9,813,652 B2
(45) Date of Patent: *Nov. 7, 2017

(54) CMOS IMAGE SENSOR AND IMAGING METHOD IMPLEMENTING CORRELATED DOUBLE SAMPLING AND COMPRESSION

(71) Applicants: Sony Corporation, Tokyo (JP); Pixim, Inc., Mountain View, CA (US)

(72) Inventors: Ping Wah Wong, Sunnyvale, CA (US); Thomas R. Ayers, Morgan Hill, CA (US)

(73) Assignees: Sony Corporation, Tokyo (JP); Pixim, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/927,129

(22) Filed: Oct. 29, 2015

(65) Prior Publication Data

US 2016/0119570 A1    Apr. 28, 2016

Related U.S. Application Data

(63) Continuation-in-part of application No. 14/744,601, filed on Jun. 19, 2015, now Pat. No. 9,413,999, which is a continuation of application No. 14/014,145, filed on Aug. 29, 2013, now Pat. No. 9,077,924.

(51) Int. Cl.
| | |
|---|---|
| *H04N 5/217* | (2011.01) |
| *H04N 5/378* | (2011.01) |
| *H04N 5/357* | (2011.01) |
| *H04N 5/3745* | (2011.01) |
| *H04N 5/335* | (2011.01) |
| *H04N 5/363* | (2011.01) |
| *H03M 3/00* | (2006.01) |

(52) U.S. Cl.
CPC ............ *H04N 5/378* (2013.01); *H04N 5/357* (2013.01); *H04N 5/3575* (2013.01); *H04N 5/37455* (2013.01); *H03M 3/342* (2013.01); *H04N 5/363* (2013.01)

(58) Field of Classification Search
CPC .. H04N 5/378; H04N 5/3575; H04N 5/37455; H04N 5/374; H04N 5/363; H03M 3/342
USPC ................................ 348/241, 294, 308–310
See application file for complete search history.

(56) References Cited

U.S. PATENT DOCUMENTS

| | | | |
|---|---|---|---|
| 5,872,596 | A | 2/1999 | Yanai et al. |
| 6,380,880 | B1 | 4/2002 | Bidermann |
| 7,456,879 | B2 | 11/2008 | Lim et al. |
| 7,502,061 | B2 | 3/2009 | Raynor |
| 7,825,975 | B2 | 11/2010 | Fowler |
| 7,884,865 | B2 | 2/2011 | Posamentier |

(Continued)

*Primary Examiner* — Ngoc-Yen Vu
(74) *Attorney, Agent, or Firm* — Michael Best & Friedrich LLP

(57) ABSTRACT

An image sensing device may include one or more compression modules that compress digitized pixel reset values obtained from light sensing elements. The device may perform a CDS operation in which the compressed reset values are stored, decompressed, and then subtracted from light dependent values obtained from the light sensing elements. The compressed reset values may also be output from the device without CDS subtraction having been performed. The light dependent values may also be compressed. CDS corrected output pixel values may also be compressed.

22 Claims, 11 Drawing Sheets

(56) References Cited

U.S. PATENT DOCUMENTS

| | | | |
|---|---|---|---|
| 7,928,889 B2 | 4/2011 | Sakurai | |
| 7,952,630 B2 | 5/2011 | Taura | |
| 8,063,963 B2 | 11/2011 | Dierickx | |
| 8,334,913 B2 | 12/2012 | Sakurai et al. | |
| 8,502,889 B2 * | 8/2013 | Hiraoka | H04N 5/37455 348/231.6 |
| 8,692,177 B2 * | 4/2014 | Kasuga | H04N 5/3575 250/208.1 |
| 8,803,993 B2 | 8/2014 | Koseki et al. | |
| 8,953,075 B2 | 2/2015 | Ayers et al. | |
| 2010/0259631 A1 * | 10/2010 | Sugita | G03B 13/36 348/222.1 |
| 2013/0147995 A1 | 6/2013 | Kim | |

* cited by examiner

CMOS IMAGE SENSOR AND IMAGING METHOD IMPLEMENTING CORRELATED DOUBLE SAMPLING AND COMPRESSION

CROSS REFERENCE TO RELATED APPLICATIONS

This application is a continuation-in-part of application Ser. No. 14/744,601, filed Jun. 19, 2015, which is a continuation of application Ser. No. 14/014,145, filed Aug. 29, 2013 (now U.S. Pat. No. 9,077,924), the entire contents of which are incorporated herein by reference.

FIELD OF THE INVENTION

The invention relates to image sensor systems and, in particular, to an active pixel CMOS image sensor implementing correlated double sampling with compression of the pixel reset values.

DESCRIPTION OF THE RELATED ART

Digital image capturing devices use image sensors to convert incident light energy into electrical signals. An area image sensor includes a two-dimensional array of light sensing elements called pixels. Each pixel in the array works with the lens system to respond to incident light within a local area of the scene, and produces an electrical signal describing the local characteristics of the scene. Outputs from the light sensing elements are converted to digital form and stored digitally to form the raw data representing the scene. The raw data can be processed by an image processor to produce rendered digital images.

Correlated double sampling (CDS) is a method that uses a reset value and a reset plus light dependent value for each pixel to eliminate noise and non-uniformity in the pixel responses of an image sensor. In the following description, the term "light dependent pixel value" will be used to refer to "a reset plus light dependent value" of a pixel. The use of CDS enables the image sensor to achieve better signal-to-noise ratio performance. To perform CDS, a pixel is reset and either the reset voltage value or a corresponding digital value is measured, resulting in a first sample value. The first sample value is stored in a memory buffer. Then the pixel is exposed to light for a pre-determined amount of time and the pixel integrates photons from the incident light to generate a voltage value dependent on the incident light level. Either the light-dependent voltage value (including the reset voltage value) or a corresponding digital value is measured, resulting in a second sample value. This is repeated for a selected image region of pixels in the sensor where the first sample values for the pixels are stored in the memory buffer. The selected image region can be the entire image, or a cropped region thereof.

In some cases, the first sample value of a pixel location is subtracted from the second sample value of the same pixel location to generate the CDS corrected output pixel value for the pixel location. In other cases, the reset value and the light dependent pixel value for the same pixel location can be thought of as two points on a line that represents the voltage of the light sensing element as a function of time, where a CDS corrected output pixel value can be calculated based on interpolation or extrapolation along the line. In each case the goal is to calculate an output pixel value for each pixel within the selected image region where pixel value variations represented by the reset value are cancelled. CDS can be implemented using analog or digital methods, and furthermore it can be designed to work on a sequential (e.g., row by row) basis, a partial frame or a full frame basis. To implement full frame digital CDS, memory is required for storing at least the array of first sample values for the entire image sensor.

Image sensor designs include Charged Coupled Devices (CCD), Complementary Metal Oxide Silicon (CMOS) image sensors, and Digital Pixel System (DPS) sensors. Image sensors can be designed to support either rolling shutter or global shutter exposure method. The difference between rolling shutter and global shutter resides in the timing that the pixels in the array are reset and exposed to light. Specifically, rolling shutter refers to an exposure method wherein the pixels in the sensor are reset and exposed to light one line at a time, thus resulting in a delay in reset and exposed time between every pair of consecutive rows. Global shutter refers to an exposure method wherein all the pixels in the array are reset and exposed to light at substantially the same time. An example of a CMOS image sensor with global shutter and full frame CDS support has been disclosed in commonly assigned U.S. Pat. No. 8,953,075, entitled "CMOS image sensors implementing full frame correlated double sampling with global shutter," filed Mar. 20, 2012 and having at least one common inventor hereof, which patent is incorporated herein by reference in its entirety.

An image sensor can be a monochrome image sensor or a color image sensor. To provide color output, a color filter array (CFA) is overlaid on top of the pixels wherein each pixel produces data values corresponding to a single primary color. FIG. 16 shows a "Bayer" CFA with RGB primary colors. Each symbol R in the figure represents a pixel coated with a red color filter and as a result the pixel provides only a red output value. Each symbol G1 or G2 in the figure represents a pixel coated with a green color filter and as a result the pixel provides only a green output value. Each symbol B in the figure represents a pixel coated with a blue color filter and as a result the pixel provides only a blue output value. In addition to RGB, CFAs with other primary colors have been known and used. Some examples include red/green/blue/white (RGBW), cyan/magenta/yellow (CMY), cyan/magenta/yellow/green (CMYG), and so on.

One disadvantage of image sensors implementing full frame or partial frame CDS is that the image sensor requires a memory buffer to store the reset values of all pixels within the selected region. The required memory buffer size is proportional to the number of pixels times the number of bits needed to represent the reset value. The size of the memory buffer often increases the system cost especially when the pixel count in practical image sensors keeps increasing. In addition, if the reset values are transmitted to a separate device for CDS processing instead of being stored in a memory buffer, then an amount of time for the transmission will depend on the number of pixels and the number of bits needed to represent the reset values. Since the resolution (pixel count) of image sensors is becoming higher, the time to transmit the reset values also increases.

Similarly, the light dependent values from either a monochrome or a color image sensor may need to be stored or transmitted to another device, depending on the system design. Since the resolution (pixel count) of image sensors is becoming higher, the amount of memory to store (or the amount of time to transmit) the light dependent pixel values also increases.

Similarly, the output pixel values after CDS correction may need to be stored or transmitted to another device, depending on the system design. Since the resolution (pixel count) of image sensors is becoming higher, the amount of memory to store (or the amount of time to transmit) the output pixel values also increases.

SUMMARY OF THE INVENTION

An image sensing device and image sensing method are described herein. By way of example, the imaging sensing device includes a two-dimensional array of light sensing elements, each light sensing element being configured to generate an output signal indicative of an intensity level of light impinging on the light sensing element, one or more analog-to-digital converters configured to digitize output signals read out from the array of light sensing elements to generate digital output pixel values, a control circuit configured to generate digital pixel reset values, and at least one compression module configured to receive the digital pixel reset values and digital light dependent values, to generate a compressed digital pixel reset value corresponding to each digital pixel reset value, and to generate a compressed digital light dependent value corresponding to each digital light dependent value.

Further, by way of example, the imaging sensing method includes providing a two-dimensional array of light sensing elements, each light sensing element is capable of generating an output signal indicative of an intensity level of light impinging on the light sensing element, reading out digital pixel reset values associated with the light sensing elements, compressing the digital pixel reset values to generate a compressed digital pixel reset value corresponding to each digital pixel reset value, and compressing the output signal indicative of an intensity level of light impinging on the light sensing element to generate a compressed light dependent value corresponding to each output signal indicative of an intensity level of light impinging on the light sensing element.

The present invention is better understood upon consideration of the detailed description below and the accompanying drawings.

DETAILED DESCRIPTION

Figure 1:
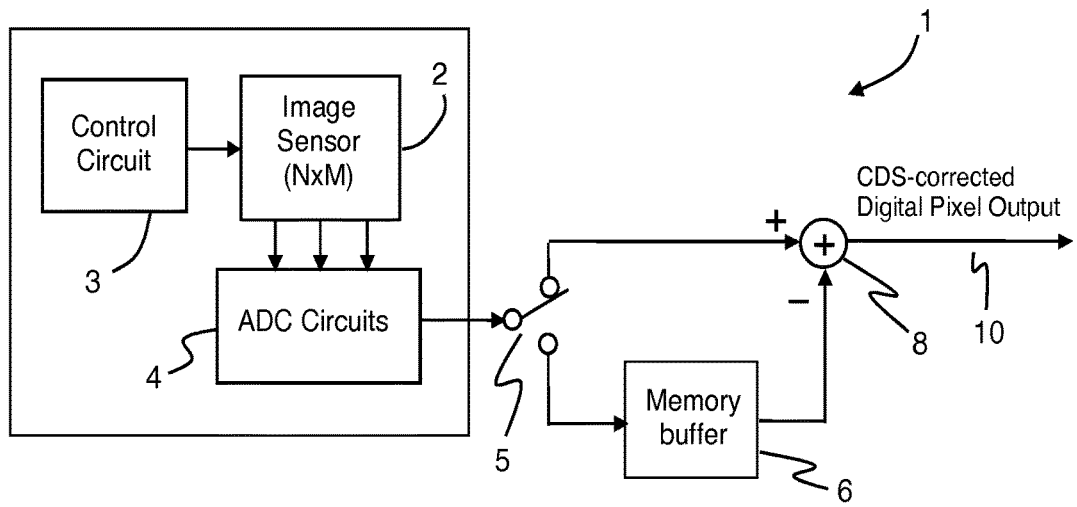
FIG. 1 is a schematic diagram of an image sensing device that supports full frame or partial frame digital CDS.

In accordance with the principles of the present invention, an image sensing device implements full frame or partial frame digital correlated double sampling (CDS) with compression of the pixel reset values, compression of the light dependent values, or both. In this manner, the memory buffer used to store a selected region in a frame of pixel reset values can be made with reduced memory size. In one embodiment, the compression of the pixel reset values, compression of the light dependent values, or both is implemented using a predictor applying a predict function to a set of neighboring decoded pixel reset values. Context information, which is the result of classification calculations, can be used in encoders to improve the compression performance. In an embodiment, a prediction function is designed so that both lossless and near lossless compression can be realized with comparable performance and without the use of context calculations, which reduces the complexity of implementing the compression of the pixel reset values, compression of the light dependent values, or both. The CDS corrected output pixel values may also be compressed.

In the present description, data compression refers to a method to reduce the data size of information by encoding the information using fewer data bits than the original representation. Compression can be either lossy or lossless. Lossless compression reduces data bits by identifying and eliminating statistical redundancy. No information is lost in lossless compression. Lossy compression reduces data bits by identifying marginally important information and removing it.

Since the purpose of the pixel reset values for CDS is to use as a reference in the CDS subtraction process to eliminate or reduce noise in the output image data, lossless compression methods are often desired. For a given output image data size, the size of the compressed pixel reset data with lossless compression is dependent on the statistical characteristics of the data. In some cases, the compressed pixel reset data, compressed using lossless compression methods, may still be too large for the desired memory buffer size. In some embodiments, lossy compression methods are applied to further reduce the size of the compressed pixel reset data. In one embodiment, a rate control method is used to dynamically adjust the compression steps so that the resulting compressed pixel reset data will fit into a memory buffer of the desired size.

In some embodiments of the present invention, the compression method in the image sensing device is configured to process multiple pixel reset values in each clock cycle. In image sensor design, for speed and timing considerations, the image sensor may process image data for multiple pixels in each clock cycle at the digital image processing module. Accordingly, in some embodiments, the compression of the pixel reset values is configured to compress or decompress (i.e. encode and decode) multiple pixels in each clock cycle so as to maintain a streamline flow of data through the image sensing device. Furthermore, in embodiments of the present invention, processing pixel reset values for multiple pixels per clock cycle does not impact the compression performance.

The image sensing device of the present invention with compression of CDS data realizes many advantageous features. First, the size of the memory buffer needed to store a selected region of a frame of pixel reset values is reduced, thereby reducing the overall image sensor cost. Second, the image sensing device implements compression rate control to control the fill rate of the memory buffer so that all the data bits of the compressed pixel reset values can fit into the memory buffer. Third, the compression of the CDS pixel reset values can be configured to process multiple pixels concurrently without impacting the compression performance.

FIG. 1 is a schematic diagram of an embodiment of an image sensing device that supports full frame and partial frame digital CDS. Referring to FIG. 1, an image sensing device 1 includes an image sensor 2 including a two-dimensional array of light sensing elements, also referred to as "pixels." In the present illustration, the pixels are arranged in a rectangular array of M (height) by N (width) pixels. Each pixel in image sensor 2 includes a photodiode and multiple control transistors connected in a configuration to control the reset, charge transfer and readout operation of the pixel.

To implement CDS, the pixels in the image sensor 2 in FIG. 1, under the control of a control circuit 3, are reset. The pixel reset values of all the pixels in the image sensor 2 are measured and digitized by the ADC circuits 4. The switch 5 is connected to the lower switch position directing the digital pixel reset values to a memory buffer 6 to be stored. When the pixels are exposed to light, the light-dependent pixel values of all the pixels in the image sensor 2 are measured and digitized by the ADC circuits 4. The switch 5 is connected to the upper switch position directing the light-dependent pixel values read out from the image sensor to the adder 8. Meanwhile, the digital pixel reset values are read from the memory buffer 6 and are subtracted from the light-dependent pixel values to generate CDS-corrected digital pixel output values. In the image sensing device 1, the memory buffer 6 must be large enough to store a selected region of a frame of digital pixel reset values. The size of the memory buffer 6 increases the cost of the image sensing device 1.

Figure 2:
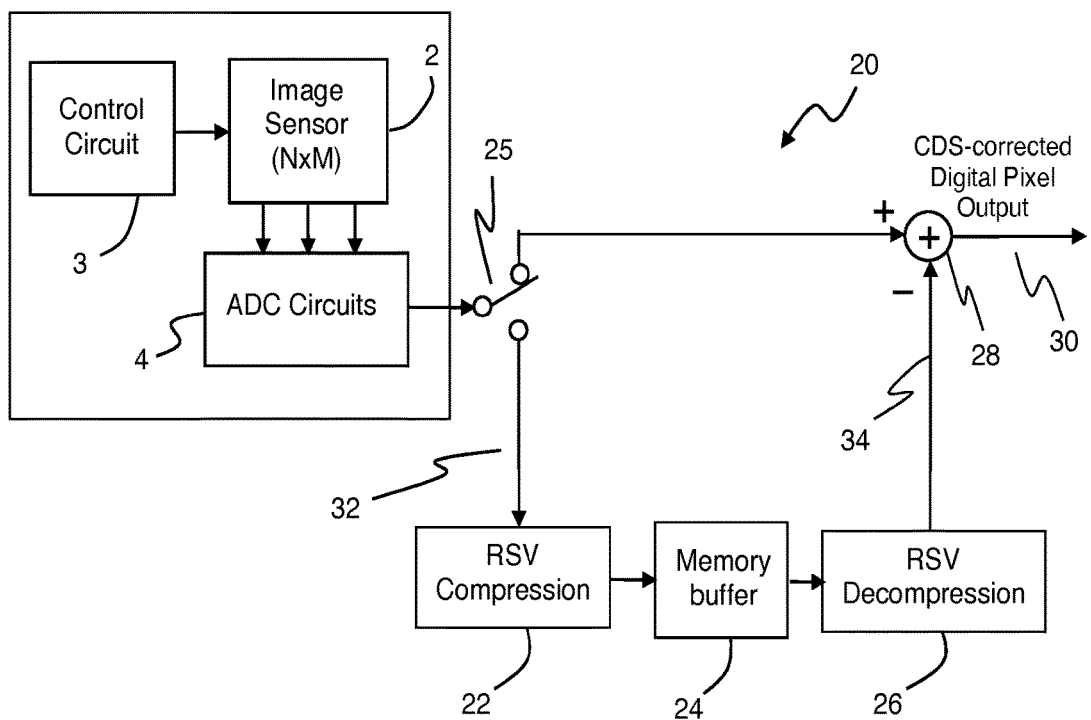
FIG. 2 is schematic diagram of an image sensing device that supports compression in full frame or partial frame digital CDS according to one embodiment of the present invention.

FIG. 2 is schematic diagram of an image sensing device that supports compression in full frame and partial frame digital CDS according to one embodiment of the present invention. Referring to FIG. 2, an image sensing device 20 includes an image sensor 2 including a two-dimensional array of light sensing elements or pixels. In the present illustration, the pixels are arranged in a rectangular array of M (height) by N (width) pixels. Each pixel in image sensor 2 includes a photodiode and multiple control transistors connected in a configuration to control the reset, charge transfer and readout operation of the pixel. The image sensing device 20 further includes analog-to-digital circuits 4 for digitizing the pixel data generated by the image sensor 2. A control circuit 3 controls the operation and timing of the control transistors in the pixels to operate the image sensor 2 in a reset mode, a light integration mode and a read-out mode.

In embodiments of the present invention, the pixels in image sensor 2 can be configured using any active pixel architecture, presently known or to be developed, having reset, and row/column select controls. Furthermore, the image sensor can be formed using various pixel cell designs, including the 4-transistor, 5-transistor or more complex active pixel cell architectures. Exemplary active pixel architectures are described in Bigas et al., "Review of CMOS image sensors," Microelectronics Journal, 2006.

In embodiments of the present invention, the image sensor 2 can either be a monochrome or a color sensor with a color filter array. To implement a color image sensor, an array of selectively transmissive filters is superimposed and in registration with each of the pixel elements. The array of selectively transmission filters includes at least a first group of filters associated with a first group of photodiodes for capturing a first color spectrum of visible light and a second group of filters associated with a second group of photodiodes for capturing a second color spectrum of visible light. Construction of color image sensors is known in the art. In some embodiments, the pixel elements are coated with individual RGB color filters arranged in a Bayer pattern. A demosaicing algorithm is used in the image processing pipeline to produce color images based on pixel data obtained from the color image sensor. In other embodiments, the pixel elements are coated with CMY color filters or other color filter patterns, in a Bayer pattern or other color filter configurations.

In some embodiments, the image sensor 2 can support either rolling shutter or global shutter. An example of a CMOS image sensor with global shutter and full frame CDS support has been disclosed in commonly assigned U.S. Pat. No. 8,953,075, entitled "CMOS image sensors implementing full frame correlated double sampling with global shutter," filed Mar. 20, 2012.

In embodiments of the present invention, the image sensing device 20 includes a memory 24 for storing digital pixel reset values. The memory buffer may be formed on the same integrated circuit as the pixel array. Alternately, the memory buffer or memory may be formed on an integrated circuit separated from the integrated circuit on which the pixel array is formed. The level of integration of the memory with the array of pixel elements of the CMOS sensor is not critical to the practice of the present invention. The image sensing device 20 may further include a CDS control and cancellation circuit to perform CDS cancellation on the image sensor and to generate the CDS corrected digital pixel output values. In the present embodiment, the CDS control and cancellation circuit is modeled as a switch 25 and an adder 28. The switch 25 and the adder 28 are used to illustrate the functional operation of the CDS control and cancellation circuit symbolically and the actual implementation of the CDS control and cancellation circuit may be different and may not include an actual switch or adder.

To implement CDS with compression, the pixels in the image sensor 2 of FIG. 2, under the control of a control circuit 3, are reset. The pixel reset values ("RSV") of all the pixels in the image sensor 2 are measured and digitized by the ADC circuits 4. The switch 25 is connected to the lower switch position directing the digital pixel reset values to the RSV compression device 22, which compresses the digital pixel reset values and stores the compressed values in the memory buffer 24. Then during the light integration phase, the pixels are exposed to light, and the light-dependent pixel values of all the pixels in the image sensor 2 are measured and digitized by the ADC circuits 4. The switch 25 is connected to the upper switch position directing the light-dependent pixel values read out from the image sensor to the adder 28. Meanwhile, the compressed digital pixel reset values are read from the memory buffer 24 and are routed through the RSV decompression device 26. The decompressed pixel reset values are subtracted from the light-dependent pixel values to generate CDS-corrected digital pixel output values.

In the present description, the term "light dependent pixel value" ("LDV") will be used to refer to a pixel value including the reset value and the light dependent value for a pixel. That is, the "light dependent pixel value" refers to "a reset plus light dependent pixel value" of a pixel for simplicity. In the present description, the terms "exposure" and "light integration" refer to the action of the light sensing element to integrate photons from incident light. The "exposure period" or "exposure time" does not necessarily refer to the time period when the light sensing element is exposed to light. In some cases, such as when electronic shutter is used, the pixel array may be exposed to light but not yet integrating photons. In the present description, a pixel element or a pixel array is said to be "exposed to light" or "integrating incident light" when the light sensing element of the pixel element is integrating photons from the incident light.

In the image sensing device 20, the digital pixel reset values are compressed to reduce the quantity of data that will need to be stored in the memory buffer 24. To that end, the image sensing device 20 includes a RSV compression module 22 coupled to receive the digital pixel reset values through the switch 25. The RSV compression module 22 generates compressed digital pixel reset values which are then stored in the memory buffer 24. Accordingly, the size of the memory buffer 24 can be reduced to reduce the cost of image sensing device 20. The image sensing device 20 further includes a RSV decompression module 26 in communication with the memory buffer 24 to read out compressed digital pixel reset values and to generate decompressed digital pixel reset values which are provided to the adder 28 for CDS cancellation.

The primary use of the pixel reset values is as a reference in the CDS cancellation process to eliminate or reduce noise in the output image data. In some embodiments, the RSV compression module 22 implements lossless compression methods. In this case, the RSV Compression input values 32 (digitized pixel reset values) and the RSV Decompression output values 34 are identical. In some cases, the lossless compression methods may generate a total size of compressed data that is still too large for a memory buffer of a desirable size. Accordingly, in some embodiments, the RSV compression module 22 also implements lossy compression methods to realize further reduction in the data bits of the compressed pixel reset values is desired. In this case, the RSV Compression input values 32 and the RSV Decompression output values 34 are different in a way controlled by the RSV Compression 22 and RSV Decompression 26 blocks.

U.S. Pat. Nos. 5,680,129 and 5,764,374, both to Seroussi et al., disclose a compression method for lossless compression of image data. The method described in Seroussi's patents encodes the image one pixel at a time in an array scan order. Specifically, for each pixel, the method includes the use of a predictor, a variable length coder, and context calculations. The purpose of context calculations is to classify the pixel into a pre-defined number of classes, so that encoding parameters corresponding to the chosen class is used in the variable length coder to encode the pixel. In other words, the compression method of the Seroussi patents uses a pre-defined number of independent variable length encoders, and the optimum encoder is chosen for each pixel according to the context. In the case where an adaptive variable length encoder is used, such as an adaptive Huffman coder or an adaptive Golomb-Rice coder, the compression method will need to maintain multiple sets of state information, one for each class, and update the state variables of the respective class according to the context.

It is well known that using a context in the encoder and decoder can provide good compression performance. However, this significantly complicates the encoder and decoder implementation because it will be necessary to maintain and update multiple sets of state variables, one for each context. In image sensor designs where the compression module will need to encode multiple pixels at each clock cycle, the context based compression method can be exceedingly complex. According to embodiments of the present invention, the RSV compression module 22 in image sensing device 20 implements a compression method using an adaptive predictive coding method without using contexts or context calculations. The RSV decompression module 26 is implemented using a corresponding adaptive predictive decoding method. In embodiments of the present invention, the RSV compression module and the RSV decompression module are implemented using at least the following elements:

Predictor;
Variable Length Coder (or Entropy Coder)
State Calculation

To further improve compression performance and to ensure that the compressed data will fit into a desired memory buffer size, a DC value calculator and a rate control algorithm can be optionally used.

Figure 3:
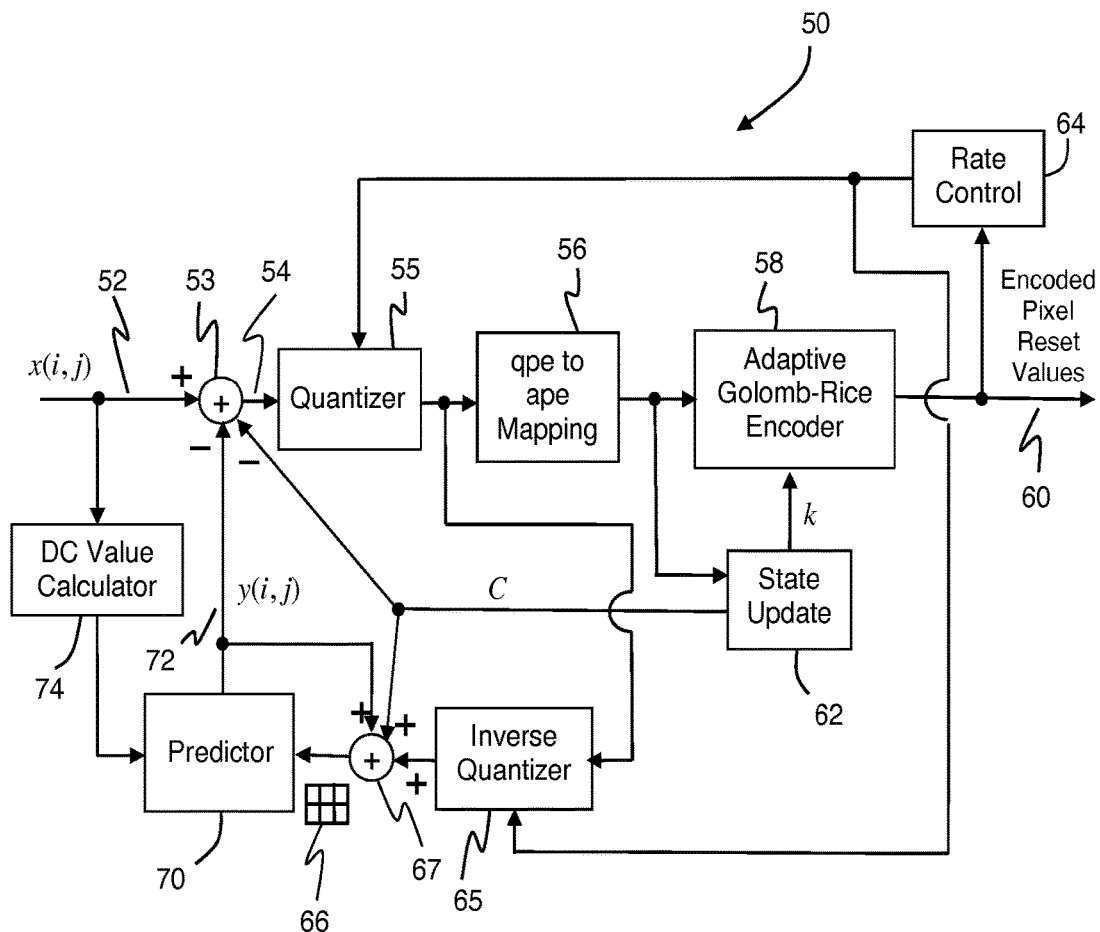
FIG. 3 is a schematic diagram of an encoding module which can be used to implement the CDS compression module in the image sensing device of FIG. 2 according to one embodiment of the present invention.

FIG. 3 is a schematic diagram of an encoding module which can be used to implement the RSV compression module 22 in the image sensing device of FIG. 2 according to an embodiment of the present invention. Referring to FIG. 3, an encoding module 50 is configured to process digital pixel reset values from the image sensor 2 one pixel at a time using an adaptive predictive coding method. In embodiments of the present invention, the encoding module 50 processes the digital pixel reset values in an array scan order. In the present description, an "array scan order" refers to the order where pixel data are read out of the image sensor array row by row. The pixel data are read out of the N×M pixel array 80 in an array scan order where pixels are read out from rows i=1 to i=M and within each row, from column j=1 to j=N. In the present embodiment, the array scan order starts from the upper left corner of the pixel array 80. This is illustrative only and in other embodiments, the array scan order can start from other corners of the pixel array.

The present invention also works with image sensors that include sequencer circuits where the sequencer circuits control the readout ordering of the pixels. For example, the pixels in an image sensor array can be read out starting from the $r^{th}$ row where r is a number between 1 and M. The readout proceeds from the $r^{th}$ row towards the bottom of the array, i.e. towards the $M^{th}$ row. After the pixel values of the $M^{th}$ row are read out, the readout proceeds from the top of the array and the remaining rows (first row to $r-1^{th}$ row) are then read out. The readout ordering that has just been described is exemplary. Sequencers in image sensors can be designed to readout the pixels in other row orderings.

In one embodiment, the encoding module 50 includes a predictor 70 generating predicted pixel reset values for each pixel, an adder 53 receiving the incoming digital pixel reset values and generating a prediction error for each pixel, a quantizer 55 generating quantized prediction errors (qpe) from the prediction error (pe) 54, a mapping module 56 to map the quantized prediction errors (qpe) to absolute-value prediction errors (ape), and an adaptive encoder 58 generating encoded or compressed digital pixel reset values. In FIG. 3, an adaptive Golomb-Rice coder is illustrated. Other entropy coder can also be used in the embodiment. The encoding module 50 further includes a state update module 62 generating the encoding parameter k for the adaptive Golomb-Rice encoder 58 and the state value C for the adders 53 and 67. The encoding module 50 further includes a rate control module 64 to modulate the distortion parameter of the quantizer 55 to control the output bit rate for the compressed digital pixel reset values. The encoding module further includes an inverse quantizer 65 to calculate a decoded prediction error dpe, which is added to the predictor output 72 and the state value C at the adder 67 to produce decoded pixel reset values. The decoded pixel values of the neighboring pixel locations (coordinates) are used by a predictor to produce a predicted pixel reset value for the current pixel.

Figure 4:
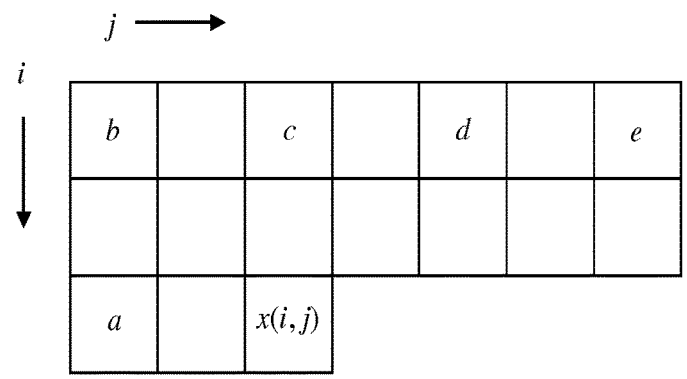
FIG. 4 illustrates the neighborhood of image pixels used in a predictor according to one embodiment of the present invention.

In an embodiment of the present invention, the predictor 70 operates on a group of neighboring decoded pixel reset values associated with pixels in the neighborhood of the current pixel being processed as illustrated in FIG. 4. The predictor 70 applies a predict function on the neighboring decoded pixel reset values to generate the predicted pixel reset value. The difference between the digital pixel reset value, the corresponding predicted pixel reset value and the state value C is the prediction error pe (node 54).

Referring to FIG. 4, in an embodiment of the present invention, for a digital pixel reset value x(i,j) associated with a given pixel at an array location (i,j), the predictor 70 uses five neighboring values x(i,j−s), x(i−s, j−s), x(i−s, j), x(i−s, j+s) and x(i−s, j+2s) to compute the predicted pixel reset value y(i, j). In FIG. 4, a digital pixel rest value x(i, j) and five neighboring decoded pixel reset values a, b, c, d and e, with s=2 are shown. In other embodiments, other values of s can be used. However, the value s=2 is particularly useful for a color image sensor where a color filter array with a Bayer pattern or other patterns is used to obtain color pixel values. In an image sensor with a Bayer color filter array, choosing s=2 is equivalent to encoding the pixels corresponding to each color position independently. In the case of a monochrome image sensor, a value of s=1 can be used. Furthermore, in other embodiments, other method can be used to select the neighborhood pixel reset values for use in the compression method of the present invention.

Figure 12:
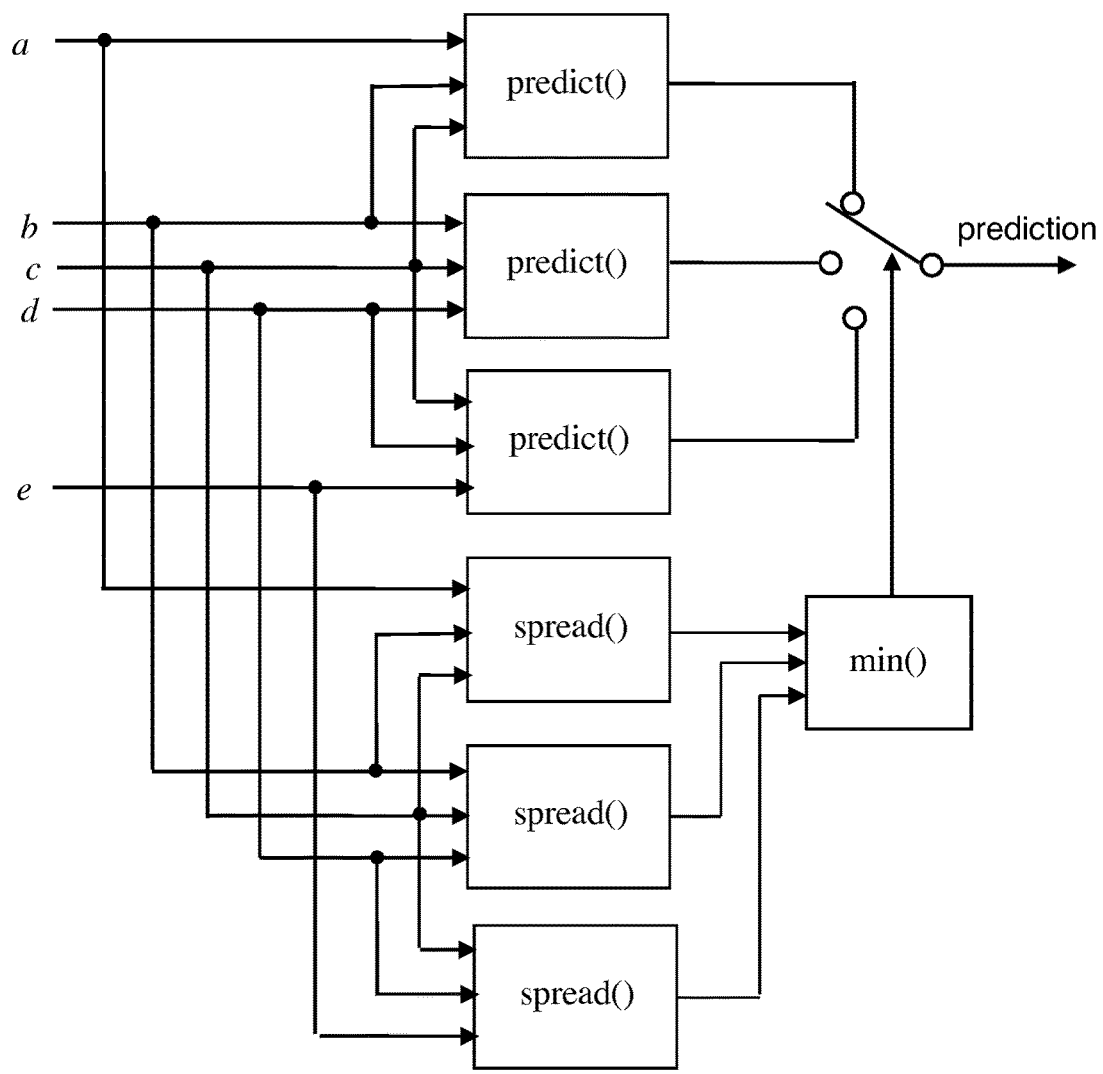
FIG. 12 is a schematic diagram of a predictor which can be used in the encoder of FIG. 3 and the decoder of FIG. 6 according to one embodiment of the invention.

In an embodiment of the present invention, the predictor 70 generates the predicted pixel reset value y(i, j) for a given pixel using a prediction device as shown in FIG. 12. Let y(i, j) be a predicted pixel reset value for digital pixel reset value x(i, j) and a, b, c, d and e denoting the neighboring decoded pixel reset values as shown in FIG. 4. Note that the positions of the pixels a, b, c, d, e are relative to location (i, j) of the pixel x(i, j), i.e., a=x(i, j−2), b=x(i−2, j−2), and so on. The predicted pixel reset value y(i, j) is given by:

$$y(i, j) = \begin{cases} \text{predict}(a, b, c) & \text{if } r0 = \min(r0, r1, r2) \\ \text{predict}(b, c, d) & \text{if } r1 = \min(r0, r1, r2) \\ \text{predict}(c, d, e) & \text{if } r2 = \min(r0, r1, r2) \end{cases}$$

where $r0 = \text{spread}(a, b, c) = \max(a, b, c) - \min(a, b, c)$ $r1 = \text{spread}(b, c, d) = \max(b, c, d) - \min(b, c, d)$ $r2 = \text{spread}(c, d, e) = \max(c, d, e) - \min(c, d, e),$ and $$\text{predict}(f, g, h) = \begin{cases} \min(f, h) & \text{if } g \geq \max(f, h) \\ \max(f, h) & \text{if } g \leq \min(f, h) \\ f + h - g & \text{otherwise} \end{cases}.$$

In the present embodiment, the predictor 70 uses a predict (f, g, h) function which takes 3 input pixel reset values f, g, and h. The neighboring decoded pixel reset values a, b, c, d and e are partitioned into three overlapping groups, where Group 0 includes the 3 pixel values {a, b, c}, Group 1 includes the 3 pixel values {b, c, d}, and Group 2 includes the 3 pixel values {c, d, e}. A spread value r for each group, which is the maximum value of the group minus the minimum value of the group, is calculated. The group with the lowest spread value, that is the group with minimum of r0, r1 or r2, is chosen, and the output of the predictor is the output of the predict( ) function for the chosen group with the smallest spread value.

By using a predictor based on an extended region of support (e.g., with 5 pixels in the neighborhood), and choosing a subset of pixels based on the spread value, the encoding module 50 can provide good performance without having to use context or perform context calculations. In this way, the overall complexity of the encoding module is reduced while good compression performance is maintained.

In processing the pixels in the image, some pixels may not have the desired number of neighboring pixel reset values. For example, for a pixel that is near the outside boundary of the image sensor, the pixel reset value x(i, j) for such a pixel may not have all five neighboring decoded pixel reset values needed by the predictor. In an embodiment of the present invention, when any particular neighboring decoded pixel rest values a, b, c, d and e are not available, a DC value is used in place of the missing neighboring decoded pixel rest value. In one embodiment, the DC value is calculated by a DC value calculator 74 (FIG. 3). In some embodiments, the first two rows of the pixel reset values are used to calculate the DC value. For instance, the average of the first two rows of the pixel reset values is used as the DC value. In other embodiments, the DC value can be set to 0. In yet other embodiments, the DC value can be calculated as the average of image data from a subset of one or more previous frames.

In the encoding module 50 shown in FIG. 3, the quantizer 55 is incorporated when lossy encoding is desired to further reduce the number of data bits generated by the encoding module. Quantizer 55 is optional and may be omitted when only lossless encoding is desired. Quantizer 55, when applied, has a distortion parameter z, resulting in a quantizer bin size of 2z+1. For example, when the distortion parameter z=1 and the quantizer bin size is 3, the quantizer 55 is configured for +/−1 encoding, that is, the decoded value will be within 1 of the original pixel value. Thus, each decoded value of the pe differs from the corresponding original pe value by at most 1. In embodiments of the present invention, a rate control module 64 is coupled to control the distortion parameter z of the quantizer 55 to adjust the rate at which the data bits of the compressed pixel reset values is generated. The operation of the rate control module 64 will be described in more detail below.

In embodiments of the present invention, the adaptive encoder is implemented using a Golomb-Rice encoder as the entropy coder for the prediction error. Entropy coders such as adaptive Huffman coder, adaptive run-length coder, or other coders can be used with the present invention. In an embodiment of the present invention, the Golomb-Rice coder is specified by an encoding parameter k. Referring to FIG. 3, the predictor error is calculated by $$pe = x(i,j) - y(i,j) - C$$

where C is a state value to adjust the prediction error so that the prediction error is close to zero mean. Calculation of C can be performed using known methods such as the method disclosed in the Seroussi's patents, and will be described in more detail below. The quantized prediction error qpe is mapped to a non-negative value or absolute value by the function:

$$ape = \begin{cases} 2*qpe & \text{if } qpe \geq 0; \\ -2*qpe - 1 & \text{otherwise} \end{cases}.$$

Note that qpe and pe may or may not have the same value. When the distortion parameter z equals zero, i.e. when doing lossless encoding, qpe and pe have the same value.

Figure 5:
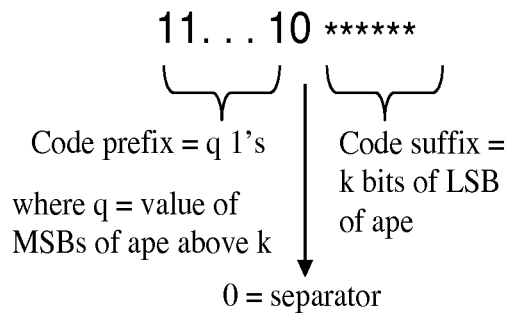
FIG. 5 illustrates the structure of the codeword generated to encode the prediction error of the pixel reset value according to one embodiment of the present invention.

The Golomb-Rice encoder 58 generates a codeword having a variable length l for each pixel determined from the absolute-value prediction error ape. FIG. 5 illustrates the structure of the codeword generated to encode the prediction error of the pixel reset value according to one embodiment of the present invention. Referring to FIG. 5, the codeword for a given pixel reset value x(i, j) is given by a concatenation of q bits of value 1, followed by a single bit of value 0, and then followed by k bits of the least significant bits (LSB) of ape. The value of q is the value of the most-significant bits (MSB) of the ape above k bits, i.e. $q = ape/2^k$ where the division is integer division with truncation. For example, let ape=13 and the original data be of 12 bit precision, which corresponds to the bit string "000000001101". Suppose k=2, then q is the value of the ten most-significant bits "0000000011" of the ape above the last two bits. Thus, q=3 and thus the codeword contains 3 bits of "1" as the leading bits. The codeword is then followed by a 0 and then followed by k bits of the LSB of the ape which is "01". Thus, for an ape value of 13 and k=2, the codeword generated is 111 0 01. Accordingly, the length l of the codeword for x(i, j) is q+1+k bits. In this example, l=6. In practice, k is initialized to an arbitrary initial value, e.g. 6. The value k is adaptively updated by the state update module 62 after each pixel reset value has been encoded.

In the predictive coding scheme used in the image sensing device of the present invention, both the encoder and the decoder use a predictor to generate a predicted pixel reset value. The encoder encodes the prediction error calculated using the predicted pixel reset value. The decoder decodes the prediction error and calculates the decoded pixel reset value using the decoded prediction error and the predicted pixel reset value. To ensure that the encoder and the decoder are synchronized with each other, both the encoder and decoder should calculate the exact same predicted pixel reset value for every pixel. Accordingly, referring to FIG. 3, the encoding module 50 includes an inverse-quantizer 65 which receives the quantized prediction error pe (node 55) to generate an inverse-quantized or recovered prediction error. The inverse-quantized prediction error is then added back with the predicted pixel reset value y(i, j) and the value C, such as at an adder 67, to generate the decoded neighboring pixel reset values for use by the predictor 70. A line buffer 66 may be used to store the neighboring decoded pixel reset values for use by the predictor 70. In this manner, the predictor 70 is operated on neighboring decoded pixel reset values that are derived from the quantized and then inverse quantized prediction errors and the encoding and decoding operation can be in sync.

As configured, the encoding module 50 generates a variable length code for each prediction error which can be considered the encoded or compressed digital pixel reset value. The compressed digital pixel reset values are bit-packed into an output bit stream on an output node 60. In some embodiments, the output bit stream of the encoding module 50 may be coupled to the memory buffer 24 where the compressed digital pixel reset values are stored. In other embodiments, the output bit stream may be coupled directly to the decompression module, or to some external storage outside of the image sensor device 20. Because the output bit stream is formed from a concatenation of variable length codewords, a FIFO (first in first out) buffer may be needed in order to maintain a constant input and output speed for the decompression module.

The performance of the Golomb-Rice code depends on the proper adaptation of the values k and C. U.S. Pat. No. 5,764,374 suggests a simple way of updating the value of k and C. To this end, the state of the coder is defined to be a set of parameters A, B, C, L and k. Since the encoding module used in the present invention does not use any context, there is only a single set of A, B, C, L and k. The values of the state variables A, B, C, L and k are calculated by the procedures in Table 1.

TABLE 1

| Update means | Update C | Calculate k |
|---|---|---|
| A += ape/2 | if (B >= L) { | for (k=0; k<cds_bpp; |
| B += pe | C++; B −= L; | k++) { |
| L += 1 | if (B >= L) B = L−1; | if ((L<<k) >= A) |
| if (L > cds_nmax) { | } else if (B < 0) { | break; |
|   L >>= 1 | C−−; B += L; | } |
|   A >>= 1 | if (B < 0) B = 0; | |
|   B >>= 1 | } | |
| } | | |

The quantity L is a running count of the pixels. It can be observed from the left box that A/L is approximately E[ape]/2 and B/L is approximately E[pe] where E is the expected value operator. The purpose of introducing the quantity cds_nmax is to slowly "forget" the samples that are far away from the present time. The quantity C is updated such that (C*L+B)/L is approximately equal to E[pe]. Note that the optimum value of k for the Golomb coder is such that $2^k$ is roughly equal to E[ape]/2. The logic in this procedure finds the optimum value of k for the Golomb-Rice coder.

In summary, the encoding module 50 operates to encode the pixel reset values one pixel at a time on a sequential basis. For every pixel, a predicted pixel value is calculated, which is used to calculate the prediction error pe. The prediction error pe is quantized. The quantized prediction error is then mapped to an absolute-value prediction error ape. The absolute-value prediction error ape is encoded using the Golomb-Rice encoder with the encoding parameter k and the resulting codeword is provided on the output node. Meanwhile, the encoding module also calculates the inverse quantized prediction error from the quantized prediction error. The inverse quantized prediction error is added to the predicted pixel reset value and the sum is written to a line buffer to be used in the predictor. Then the state variables are updated according to Table 1 and the process continues to the next pixel.

Figure 6:
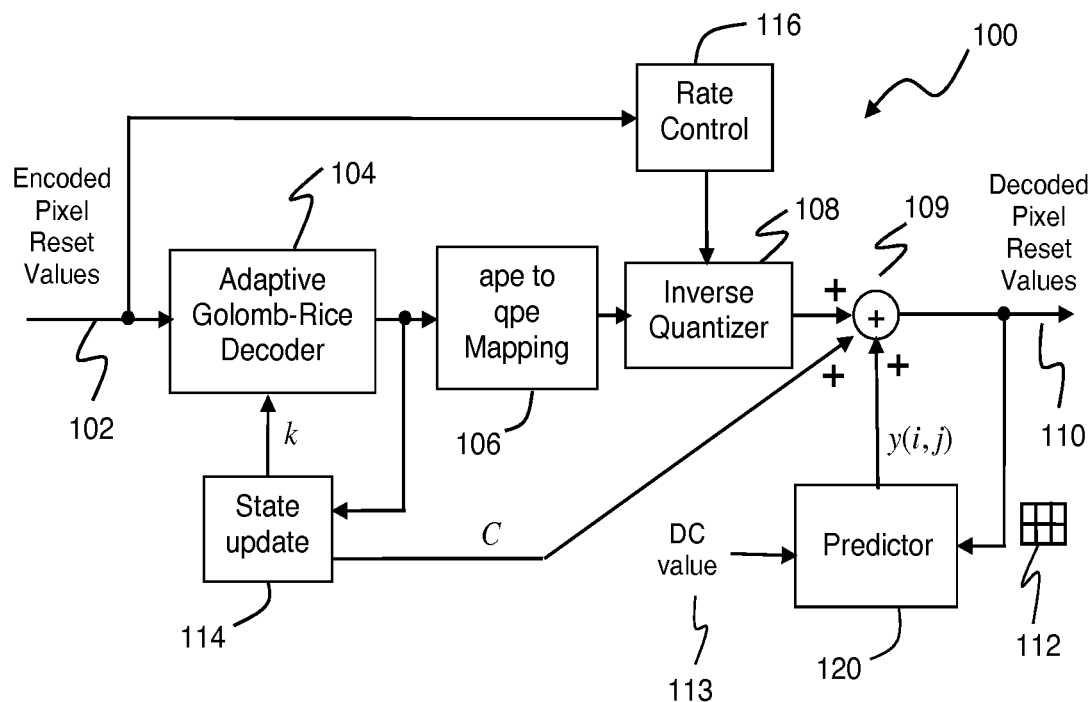
FIG. 6 is a schematic diagram of a decoding module which can be used to implement the CDS decompression module in the image sensing device of FIG. 2 according to one embodiment of the present invention.

FIG. 6 is a schematic diagram of a decoding module which can be used to implement the CDS decompression module in the image sensing device of FIG. 2 according to an embodiment of the present invention. The decoding module 100 operates in the reverse way in relation to the encoding module 50 of FIG. 3. Referring to FIG. 6, the decoding module 100 receives the bit stream of compressed digital pixel reset values on an input node 102. The input bit stream is provided to an adaptive Golomb-Rice decoder 104 to produce a decoded value. The decoded value is the absolute-value prediction error ape, which is a mapped value of the quantized prediction error qpe. The ape is coupled to a mapping module 106 to generate the quantized prediction error qpe. Then, an inverse-quantizer 108 applies inverse quantization to the quantized prediction error qpe to recover the prediction error pe within a distortion given by the distortion parameter used during encoding. The decoded prediction error pe is added to a predicted pixel reset value y(i, j) and the state value C to generate the decoded or decompressed pixel reset value x(i,j) on an output node 110. The predicted pixel reset value y(i, j) is generated by a predictor 120 which operates on a set of neighboring decoded pixel reset values that may be stored in a line buffer 112. A DC value 113 may also be used as in the encoder when there is missing neighboring decoded pixel reset values. In operation, the decoding module 100 is synchronized with the encoding module by using a rate control mechanism 116 and state update mechanism that performs the same calculations as in the encoder 50.

As described above, the compression method described above requires s line buffers in both the encoding module and the decoding module, where encoding and decoding of each pixel require pixel values from s prior rows. A value that provides good compression performance in most image sensors is s=2, although other values of s can be used.

In some embodiments, the image sensing device incorporates a data path that processes multiple pixels per clock cycle in order to boost the throughput of the image sensor. In that case, the RSV compression module of the image sensing device will need to encode multiple pixel reset values associated with adjacent pixels per clock cycle. Similarly, the RSV decompression module of the image sensing device should decode multiple compressed pixel reset values associated with adjacent pixels per clock cycle. For example, in some embodiments, the image sensing device processes four adjacent pixels on the same row in the data processing data path.

Figure 7:
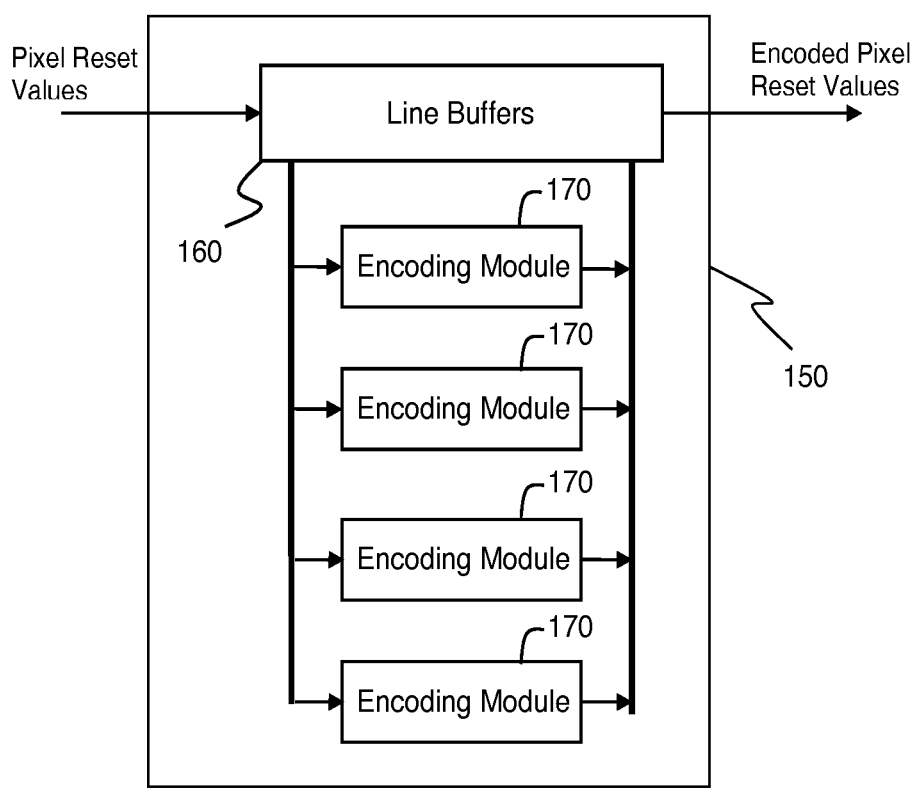
FIG. 7 is a schematic diagram of a CDS compression module for encoding multiple digital pixel reset values according to one embodiment of the present invention.

FIG. 7 is a schematic diagram of a RSV compression module 150 for encoding multiple digital pixel reset values according to one embodiment of the present invention. Referring to FIG. 7, a RSV compression module 150 includes four encoding modules 170 for encoding four digital pixel reset values in parallel in each clock cycle. Each encoding module 170 can be implemented in the same manner as the encoding module of FIG. 3 for processing a single digital pixel reset value. In another embodiment, one copy of the rate control element 64 can be shared among the encoding modules. The RSV compression module 150 further includes line buffers 160 for storing incoming digital pixel reset values for encoding and compressed digital pixel reset values for read out. In one embodiment of the present invention, the line buffers 160 include 6 lines of buffer memory to manage the flow of data.

In the encoding modules, the calculation for updating the state variables according to Table 1 above can be computational intensive and may require multiple clock cycles to complete one update calculation. In one embodiment of the present invention, the state update module in each encoding module is configured to perform the state update calculation for variables in Table 1 in two clock cycles. In one embodiment, when the RSV compression module 150 is configured to process 4 pixels in a row in every clock cycle, and the state update module will perform the state update calculation in two clock cycles, this results in state update for any one of the encoding modules 170 once every 8 pixels in a row.

Figure 8:
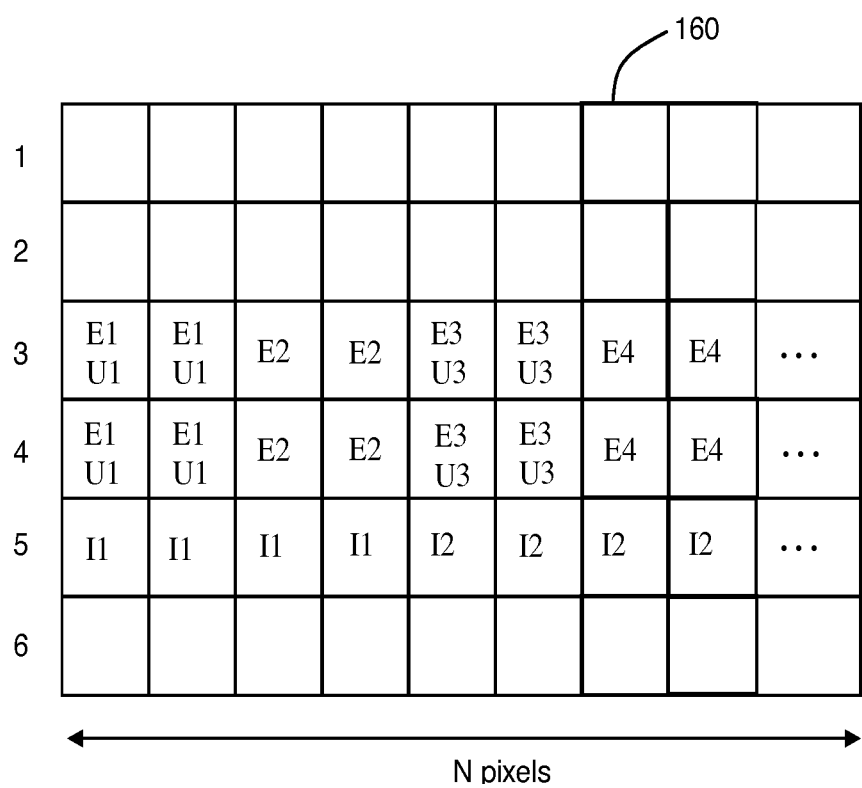
FIG. 8 illustrates the line buffer which can be incorporated in the CDS compression module of FIG. 7 according to one embodiment of the present invention.

In embodiments of the present invention, the RSV compression module 150 is configured to encode digital pixel reset values stored in the line buffers 160 using a formation different from the array scan order in order to minimize the latency between updating of the state variables in Table 1. FIG. 8 illustrates the line buffer which can be incorporated in the RSV compression module 150 of FIG. 7 according to one embodiment of the present invention. Referring to FIG. 8, the line buffer 160 includes 6 lines of memories, where each line of memories is disposed to store one row of pixel reset values from the image sensor. That is, each line of the line buffer 160 includes N memory elements. FIG. 8 illustrates the operation of the encoding module on the pixel reset values stored in the line buffer over several clock cycles.

In FIG. 8, the encoder is at a state where the top 4 lines (lines 1-4) of the line buffers 160 are filled with pixel reset values. Specifically, the top 2 lines (lines 1-2) store decoded pixel reset values while the middle two lines (lines 3-4) store pixel values that have not yet been encoded. The bottom 2 lines (lines 5-6) are empty and are ready to receive incoming pixel reset values to be encoded.

In operation, incoming pixel reset values "I" are stored into the line buffer in array scan ordering. Thus, in the present illustration, four pixel reset values I1 are received in line 5 of the line buffer 160 during the first clock cycle for the scan line and four adjacent pixel reset values I2 are received in line 5 the next clock cycle. The character I represents incoming pixels and the numerical index indicates the clock cycle from the beginning of the line. The four pixels in each group, e.g. I1, could have different pixel values. The incoming pixel reset values are received in array scan ordering. The decoded pixel reset values in lines 1 and 2 as well as the previous decoded pixel values in lines 3 and 4 (i.e., to the left side of the current pixel value) are used in the prediction calculations. Meanwhile, the encoding modules operate on the pixel reset values stored in the middle two lines, lines 3 and 4, of the line buffer 160. More specifically, in order to minimize the latency or the number of pixels between updating of the state variables, the encoding modules 170 process four pixels in a 2×2 configuration within a clock cycle. For example, in the first clock cycle for the scan line, four pixel reset values at the pixel locations E1U1 are encoded using state variables that have been previously calculated. The character E denotes execution of an encoding procedure and the numerical index indicates the clock cycle from the beginning of the line. The predictor may use the decoded pixel reset values stored in lines 1 and 2 as the neighboring decoded pixel reset values to calculate the predicted pixel reset values for the pixel locations E1U1. Meanwhile, the state update modules are activated to calculate the state variables according to Table 1. The character U denotes execution of a state update procedure and the numerical index indicates the clock cycle from the beginning of the line. When the pixels at the four locations are encoded, the encoded bits are packed and are sent to the output, e.g. to the memory buffer 24 for storage. In addition, the encoder also calculates the decoded pixel values using the inverse quantizer 65 and the adder 67. The decoded pixel values are written back to the corresponding locations in lines 3 and 4 of the line buffer.

In one embodiment, the state update modules uses two clock cycles to complete the state update calculation. Thus, in the next clock, 4 pixels at the pixel locations E2 are encoded using the same state variables as in the locations E1U1. Since the previous state update procedure is not yet completed and a new state update procedure is not started, there is no U2 notation in FIG. 8. At this clock cycle, 4 pixels denoted by I2 enter the line buffers and are stored in row 5 in array scan ordering. The process of encoding 2×2 blocks of pixel reset values continues, with state update invoked in every other clock cycle. At the end of clock 2, another 2×2 block of pixel reset values at pixel locations E2 has been encoded, and the encoded bits are sent to the output, e.g. to the memory buffer 24. The decoded values calculated by the encoder are written back to the corresponding locations of lines 3 and 4. Meanwhile, the updating of the state variables, which was started at E1U1, is also completed. Then, at clock 3 for the scan line, another 2×2 block of pixel reset values at pixel locations E3U3 is encoded using the updated state variables. By using the 2×2 block formation, even though the state variables are updated every two clock cycles, the pixel reset values are encoded with updated state variables every 4 pixels instead of every 8 pixels when array scan ordering is being used.

When the encoding procedure arrives at the middle of lines 3 and 4, the buffer at line 5 is filled with new pixel values. The encoding procedure continues from the middle of lines 3 and 4, where the incoming pixel values are now written to line 6. When all the pixels in lines 3 and 4 are encoded, the incoming pixels also completely fill up lines 5 and 6. The data in the line buffers of FIG. 8 are shifted two lines up, and the procedure repeats. Other methods, such as rotating the line pointer, can also be used to achieve the same effect as in shifting the data in the line buffers.

Figures 9, 10:
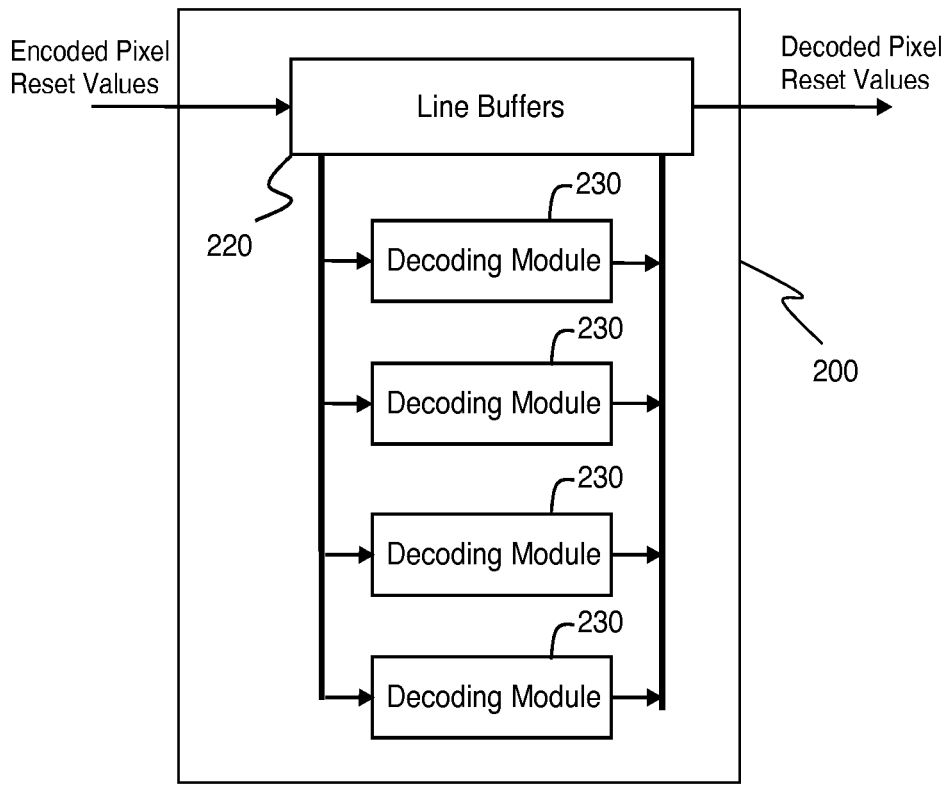
FIG. 9 is a schematic diagram of a CDS decompression module for decoding multiple digital pixel reset values according to one embodiment of the present invention.
FIG. 10 illustrates the line buffer which can be incorporated in the CDS decompression module of FIG. 9 according to one embodiment of the present invention.

FIG. 9 is a schematic diagram of a RSV decompression module 200 for decoding multiple digital pixel reset values according to one embodiment of the present invention. Referring to FIG. 9, a RSV decompression module 200 includes four decoding modules 230 for decoding four digital pixel reset values in parallel in each clock cycle. Each decoding module 230 can be implemented in the same manner as the decoding module of FIG. 6 for processing a single compressed digital pixel reset value. In another embodiment, one copy of the rate control element 116 can be shared among the decoding modules. The RSV decompression module 200 further includes line 220 for storing decompressed digital pixel reset values for read out. In embodiments of the present invention, the line buffers 220 include 4 lines of buffer memory to manage the flow of data.

FIG. 10 illustrates the line buffer which can be incorporated in the RSV decompression module 200 of FIG. 9 according to one embodiment of the present invention. Referring to FIGS. 2, 9 and 10, in embodiments of the present invention, the RSV decompression module 200 receives the bit stream either from the RSV compression module 150 or from the memory buffer 24. The bit stream includes encoded pixel reset values in a 2×2 block formation. The decoding modules 230 can then operate on the encoded pixel reset values also in a 2×2 block formation. The line buffers 220 include four lines of buffer memories. The top two lines (lines 1-2) contain decoded or decompressed pixel reset values which can be read out and also be used by the predictor to calculate the predicted pixel reset values. The bottom two lines (lines 3-4) contain pixel reset values being decoded. The updating steps for the state variables according to Table 1 are started in alternating clock cycles as in the encoding modules. Thus, in clock 1 for the scan line, pixel reset values at pixel locations D1U1 in a 2×2 formation are decoded using the state variables from previous calculation. The character D denotes a decoding operation and the numerical index indicates the clock cycle from the beginning of the line. The notation U1 has the same meaning as in the encoder. Meanwhile, pixels at locations O1 in line 1 are sent to the output in pixel scan ordering. The character O denotes sending decoded pixel values to the output and the numerical index indicates the clock cycle from the beginning of the line. In clock 2 for the scan line, pixel reset values at pixel locations D2 in a 2×2 formation are decoded. There is no U2 notation in FIG. 10 because the state update that was started at the previous location has not been completed yet. State update that was started at pixel location D1U1 is now completed. Within clock 2 for the scan line, the next 4 pixels at pixel locations O2 in line 1 are sent to the output. Then in clock 3 for the scan line, pixel reset values at pixel locations D3U3 in a 2×2 formation are decoded. Meanwhile the state variables have been updated so that pixel reset values at pixel locations D3U3 are decoded using the updated state variables. When the decoding process arrives at the middle of lines 3 and 4, all the pixels from line 1 has been sent to the output. The process continues with decoding the rest of pixels in lines 3 and 4, and pixels in line 2 are sent out in pixel scan order. The decoding process continues in this manner.

Depending on the statistical characteristics of the pixel reset values and the size of the memory buffer, the size of the output bit stream after compression may not fit the total memory buffer size. In an embodiment of the present invention, the RSV compression module implements a rate control algorithm to control the distortion level of the quantizer to achieve a target memory size. The same rate control calculations are executed at both the encoder and decoder so that the same distortion level is applied to the RSV decompression module to synchronize the encoding and decoding operations.

Figure 11:
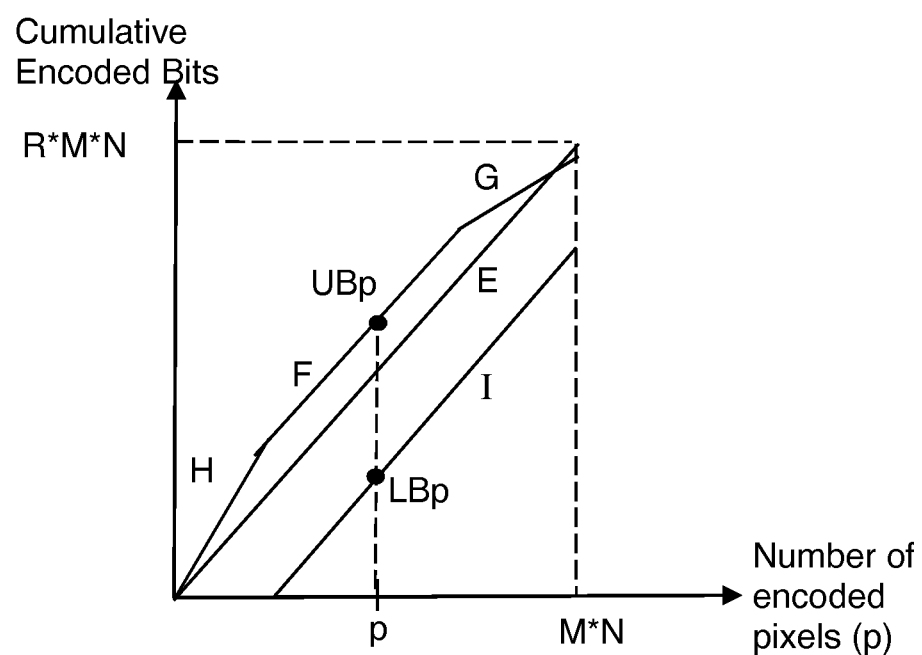
FIG. 11 is a plot of the ideal data bit fill rate of the memory buffer together with upper and lower bounds to illustrate the operation of the rate control algorithm according to one embodiment of the present invention.

In operation, the rate control module implements a rate control algorithm that calculates at each pixel location p the total number of bits Sp that is used from the first pixel through the $p^{th}$ pixel. Then, the algorithm makes a decision to either increase the instantaneous distortion, reduce the instantaneous distortion, or maintain the same instantaneous distortion. FIG. 11 is a plot of the data bit fill rate of the memory buffer to illustrate the operation of the rate control algorithm according to one embodiment of the present invention. Referring to FIG. 11, the horizontal axis represents the number of pixels that have been processed (encoded), and the vertical axis represents the total number of output data bits from the first pixel to the current pixel. Let R be the target bit rate on a per pixel basis. Hence for a total of M*N pixels in the image sensor, the total number of bits allowed is R*M*N. In other words, R*M*N is the memory buffer size. The line E in FIG. 11 represents the ideal performance curve if every pixel would be encoded at a constant bit rate. For a practical image, the actual plot of bit rate versus p will fluctuate and deviate from the line E especially if the encoding is at lossless or near lossless mode. The piecewise linear lines F, G and H set an upper bound to the encoding bit rate, whereas the line I represents a lower bound to the encoding bit rate. In a preferred embodiment, the four lines are given by:

$$H:(R+0.5)*p$$

$$G:(R-1)*p+M*N-256$$

$$F:R*p+N*K$$

$$I:R*p-N*K*(\log_2(2*distortion+1)-\log_2(2*distortion-1))$$

where p is the number of pixels that have been encoded so far, M is the height of the image, N is the width of the image, and K is a predefined constant. The upper and lower bounds are examples that were chosen for ease of calculation. Other bounds can be chosen to work with the present invention.

In operation, at a pixel location p, the total number of bits Sp that have been used up to that point is calculated. The upper threshold UBp is a point on lines F, G and H for any given value of p between 0 and M*N. The lower threshold LBp is a point on line I. The rate control algorithm operates in such a manner that if Sp>UBp, then the distortion parameter for the quantizer is increased by 1. If Sp<LBp, the distortion parameter is decreased by 1.

To prevent the distortion parameter from being adjusted upwards too often because of spurious rate fluctuations, the rate control algorithm will stop considering any distortion parameter adjustments for V pixels immediately after each distortion adjustment. Since it is important to operate the rate control method such that the final bit rate, i.e. the total number of bits used to encode the entire image, is within the bit budget R*M*N, the delay value V can be reduced as p approaches M*N. That is, when the encoding process is near the end of the image, the distortion parameter adjustments can happen more frequently.

Figure 13:
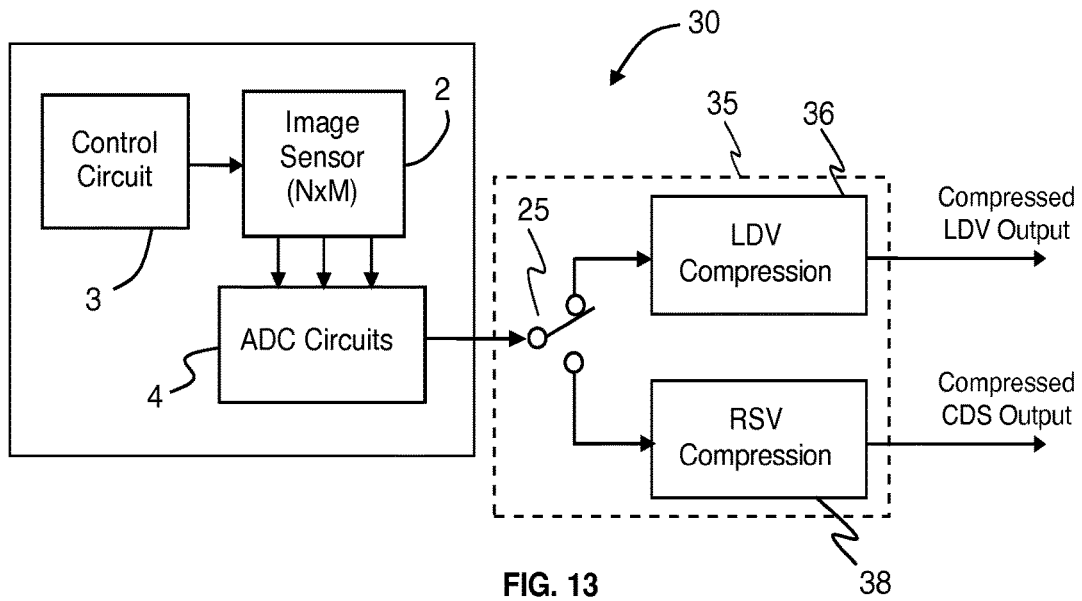
FIG. 13 is a schematic diagram of an image sensing device that supports compression in full frame or partial frame for both digital reset and light dependent values according to one embodiment of the present invention.

In addition to compressing only the pixel reset values, an image sensing device can compress both the pixel reset values and the light dependent values from either a monochrome or a color image sensor. FIG. 13 shows a schematic diagram of an image sensing device 30 of an embodiment in which both the pixel reset values and the light dependent values are compressed. Components of the image sensing device 30 that have a same structure as components of the image sensing device 20 are labeled with the same reference numbers, and duplicative explanation of their function is omitted.

The image sensing device 30 of FIG. 13 has a compression section 35, which includes a switch 25, an RSV compression module 38, and an LDV compression module 36. The pixel reset values are directed by the switch 25 to the RSV compression module 38, while the light dependent values are directed by the switch 25 to the LDV compression modules 36. The RSV compression module 38 compresses the pixel reset values. The LDV compression module 36 compresses the light dependent values. For example, the RSV compression module 38 and the LDV compression module 36 may use predictive lossless and lossy encoding methods similar to those discussed above with regard to the RSV compression modules 22 and 150. For a monochrome image sensor, the LDVs may be compressed as a single array as in RSV compression. For a color image sensor, either the LDVs may be compressed in a single array as in RSV compression, or the LDVs may be partitioned according to the color of the pixels and then compression may be performed on a color by color basis. Depending on the transmission or storage requirement of the system, RSV compression may be configured to use a lossless or lossy compression mode, and LDV compression may be configured to use a lossless or lossy compression mode independent of the RSV compression mode. Instead of using a fixed configuration, each of the compression modules may include a bit rate control mechanism such as the one illustrated in FIG. 11 to adjust the distortion (and hence the bit rate) dynamically as the RSV and LDV are being compressed. Alternatively, other known compression methods and/or other known bit rate control methods can also be used by the RSV compression module 38 and the LDV compression module 36. The compressed values output by the RSV compression module 38 and the LDV compression module 36 may then be subjected to additional processing (e.g., digital CDS processing) (not illustrated), or may be output from the image sensor to another device.

Figure 14:
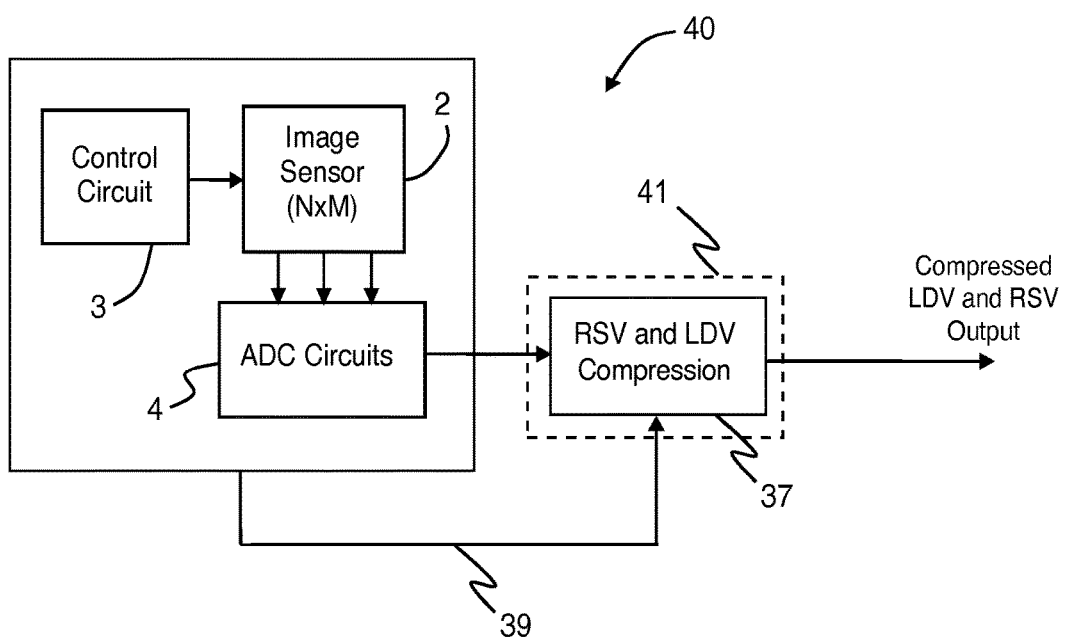
FIG. 14 is a schematic diagram of an image sensing device that supports compression in full frame or partial frame for both digital reset and light dependent values sharing the same compression circuit or processing routine according to one embodiment of the present invention.

FIG. 14 shows an image sensing device 40 of another embodiment, in which both the pixel reset values and the light dependent values are compressed by the same compression circuit or processing routine. In particular, the image sensing device 40 has a compression section 41 that includes a single compression unit—the RSV and LDV Compression module 37—that compresses both the RSVs and the LDVs. It will be understood that in this context "single compression unit" means merely that the same processing circuits or processing routines that compress the RSVs are also used to compress the LDVs, and reference to a "single compression unit" is not meant to imply that other compression units cannot be included in the device 40 for compressing other values besides the RSVs and LDVs. In addition, it will be understood that the "single compression unit" (e.g., RSV and LDV Compression module 37) may itself include multiple encoder modules, as illustrated in FIG. 7. The pixel reset values are input to the RSV and LDV compression module 37, compressed, and then output as compressed reset values. Then, the light dependent values are input to the RSV and LDV compression module 37, compressed, and then output as compressed light dependent values. For example, the RSV and LDV compression module 37 may use predictive lossless and lossy encoding methods similar to those discussed above with regard to the RSV compression modules 22 and 150. For a monochrome image sensor, the LDVs may be compressed as a single array as in RSV compression. For a color image sensor, either the LDVs may be compressed in a single array as in RSV compression, or the LDVs may be partitioned according to the color of the pixels and then compression may be performed on a color by color basis. During compression, the RSV and LDV compression module 37 may be configured to use the same or different lossless/lossy compression modes for the RSV and LDV. Instead of using a fixed configuration, each of the compression modules may include a bit rate control mechanism such as the one associated with FIG. 11 to adjust the distortion (and hence the bit rate) dynamically as the RSV and LDV are being compressed. Alternatively, other known compression methods and/or other known bit rate control methods can also be used by the RSV and LDV compression module 37. The sensor circuit may send an indicator signal 39 for the purpose of indicating whether the digital values being input to the RSV and LDV compression module 37 are pixel reset values or light dependent values. The indicator signal can be provided, for example, by the internal circuits of the image sensors. For example, the indicator signal can be provided by the control circuit 3. The compressed values output by the RSV and LDV compression module 37 may then be subjected to additional processing (e.g., digital CDS processing) (not illustrated), or may be output from the image sensor to another device.

Figure 15:
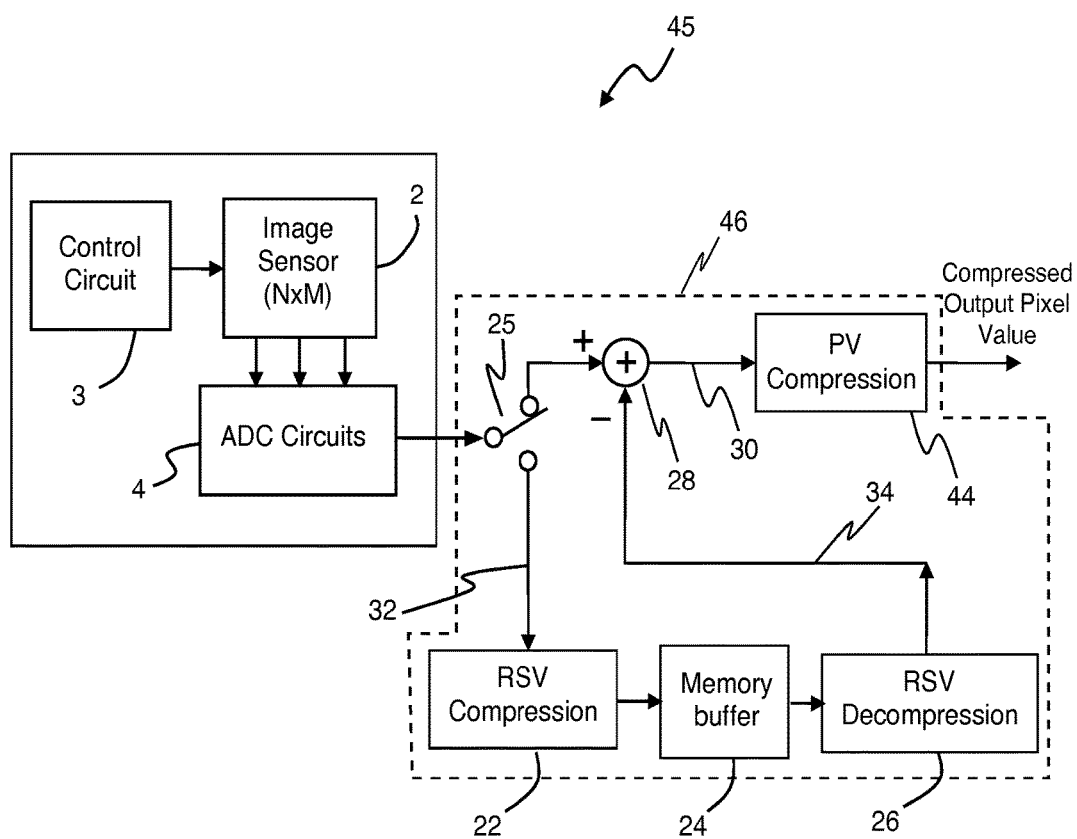
FIG. 15 is a schematic diagram an image sensing device that supports compression in full frame or partial frame for both digital reset and output pixel values according to one embodiment of the present invention.
Figure 16:
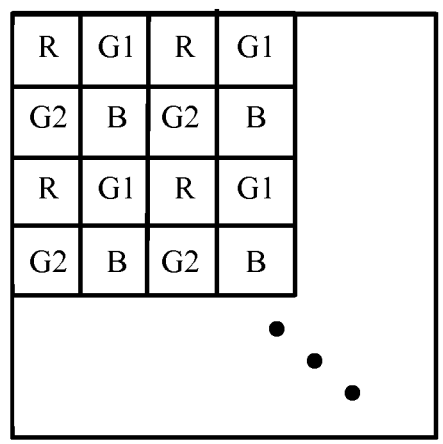
FIG. 16 illustrates a Bayer color filter array with red, green and blue primary colors.

FIG. 15 shows an image sensing device 45 of another embodiment, in which both the pixel reset values and the CDS corrected output pixel values are compressed. The image sensing device 45 has a compression section 46 that includes a PV compression module 44 in addition to various components that are similar in structure and operation to components of the image sensing device 20 (similar components are given the same reference numbers, and duplicative description of their structure and function is omitted). As already described with respect to the image sensing device 20, the pixel reset values are compressed by the RSV compression module 22 and stored in the memory buffer 24, and then when the light dependent values are output from the image sensor, CDS is achieved by decompressing the compressed reset values and subtracting the decompressed reset values from the light dependent values at the adder 28, resulting in CDS corrected pixel values 30. In the image sensing device 45, the CDS corrected pixel values 30 are input to the PV compression module 44, which compresses the CDS corrected pixel values 30, thereby generating compressed output pixel values. For example, the PV compression module 44 may use predictive lossless and lossy encoding methods similar to those discussed above with regard to the RSV compression modules 22 and 150. For a monochrome image sensor, the LDVs may be compressed as a single array as in RSV compression. For a color image sensor, either the LDVs may be compressed in a single array as in RSV compression, or the LDVs may be partitioned according to the color of the pixels and then compression may be performed on a color by color basis. During compression, RSV compression may be configured to use a lossless or lossy compression mode, and PV compression may be configured to use a lossless or lossy compression mode independent of the RSV compression mode. Instead of using a fixed configuration, each of the compression modules may include a bit rate control mechanism such as the one associated with FIG. 11 to adjust the distortion (and hence the bit rate) dynamically as the RSV and PV are being compressed. Alternatively, other known compression methods and/or other known bit rate control methods can also be used by the PV compression module 44.

Although FIG. 15 illustrates separate modules for performing reset value compression and pixel value compression (i.e., the RSV compression module 22 and the PV compression module 44), it will be understood that reset value compression and pixel value compression could be performed by the same compression circuit or processing unit. For example, if the PV compression module 44 is omitted, the CDS corrected values 30 output by the adder 28 could be fed back as inputs into the RSV compression module 22, compressed, and then output as compressed output pixel values.

The above detailed descriptions are provided to illustrate specific embodiments of the present invention and are not intended to be limiting. Numerous modifications and variations within the scope of the present invention are possible. For example, different active pixel cell designs may be used in an image sensor to achieve full frame or partial frame digital CDS with global shutter, different pixel value readout methods and timings may be used, etc. Furthermore, the compression methods, rate control approach, and detailed calculations may be changed. The present invention is defined by the appended claims.

We claim:

1. An image sensing device comprising:
an array of light sensing elements configured to output reset signals and light-dependent (LD) signals;
an analog-to-digital converter circuit configured to digitize the reset signals into digital reset values and to digitize the LD signals into digital LD values;
compression circuitry configured to generate compressed digital reset values based on the digital reset values and to generate compressed digital LD values based on the digital LD values.

2. The image sensing device of claim 1,
wherein the compression circuitry comprises a switch, reset value compression circuitry, and LD compression circuitry,
the switch is configured to direct the digital reset values to the reset value compression circuitry, and to direct the digital LD values to the LD compression circuitry,
the reset value compression circuitry is configured to generate the compressed digital reset values based on the digital reset values, and
the LD value compression circuitry is configured to generate the compressed digital LD values based on the digital LD values.

3. The image sensing device of claim 2,
wherein the reset value compression circuitry is configured to generate the compressed digital reset values by, for each of digital reset values:
generating a predicted reset value based on a prediction function,
generating a prediction error based on the predicted reset value; and
generating one of the compressed digital reset values based on the prediction error.

4. The image sensor of claim 3,
wherein the reset value compression circuitry further includes: a quantizer configured to generate a quantized prediction error associated with each digital reset value; mapping circuitry configured to map the quantized prediction error to an absolute-value prediction error for each digital reset value; a state update generator configured to generate an encoding parameter based on the absolute-value prediction error; and an encoder configured to encode the absolute-value prediction error based on the encoding parameter to generate the compressed digital reset value for each digital reset value.

5. The image sensing device of claim 2,
wherein the reset value compression circuitry includes a Golomb-Rice encoder.

6. The image sensing device of claim 1,
wherein the compression circuitry further includes rate control circuitry to control a distortion parameter of the compression section based on the total number of data bits generated by the compression circuitry.

7. The image sensing device of claim 1,
wherein the compression circuitry includes a plurality of encoders in communication with a line buffer, the line buffer being configured to store incoming digital values from the analog-to-digital converter circuit, and wherein the compression circuitry is configured to generate in each clock cycle a plurality of compressed digital values corresponding to a plurality of the light sensing elements.

8. The image sensing device of claim 7, wherein the line buffer receives the incoming digital values in an array scan ordering, the plurality of encoders are configured to encode the digital values stored in the line buffer in a formation that is different from the array scan ordering.

9. The image sensing device of claim 1, wherein the compressed digital reset values include variable bit-length digital values of average bit-length l, the average bit-length l being less than the bit-length of the digital reset value.

10. The image sensing device of claim 1, wherein the compression circuitry comprises a single compression circuit that is configured to generate the compressed digital reset values based on the digital reset values and to generate the compressed digital LD values based on the digital LD values.

11. The image sensing device of claim 1, wherein the image sensing device is a color image sensor, and the LD values are color LD values.

12. An image sensing device comprising:
an array of light sensing elements configured to output reset signals and light-dependent (LD) signals;
an analog-to-digital converter circuit configured to digitize the reset signals into digital reset values and to digitize the LD signals into digital LD values;
reset value compression circuitry configured to generate compressed digital reset values based on the digital reset values;
reset value decompression circuitry configured to generate decompressed digital reset values based on the compressed digital reset values; and
pixel value compression circuitry configured to generate compressed digital pixel values based on the decompressed digital reset values and on the digital LD values.

13. The image sensing device of claim 12, wherein the pixel value compression circuitry includes:
CDS subtraction circuitry configured subtract the decompressed digital reset values from the digital LD values to obtain digital pixel values, and
pixel value compression circuitry configured to generate the compressed digital pixel values based on the digital pixel values.

14. The image sensing device of claim 12, wherein the reset value compression circuitry is configured to generate the compressed digital reset values by, for each of digital reset values:
generating a predicted reset value based on a prediction function,
generating a prediction error based on the predicted reset value; and
generating one of the compressed digital reset values based on the prediction error.

15. The image sensing device of claim 14, wherein the reset value compression circuitry further includes: a quantizer configured to generate a quantized prediction error associated with each digital reset value; mapping circuitry configured to map the quantized prediction error to an absolute-value prediction error for each digital reset value; a state update generator configured to generate an encoding parameter based on the absolute-value prediction error; and an encoder configured to encode the absolute-value prediction error based on the encoding parameter to generate the compressed digital reset value for each digital reset value.

16. The image sensing device of claim 12, wherein the reset value compression circuitry further includes rate control circuitry to control a distortion parameter of the reset value compression circuitry based on the total number of data bits of compressed digital reset values being generated.

17. The image sensing device of claim 12, wherein the pixel value compression circuitry further includes rate control circuitry to control a distortion parameter of the pixel value compression circuitry based on the total number of data bits of compressed digital pixel values being generated.

18. The image sensing device of claim 12, wherein the reset value compression circuitry includes a Golomb-Rice encoder.

19. The image sensing device of claim 12, wherein the reset value compression circuitry includes a plurality of encoders in communication with a line buffer, the line buffer being configured to store incoming digital reset values to be compressed, and wherein the reset value compression circuitry is configured to generate in each clock cycle a plurality of the compressed digital reset values corresponding to a plurality of the light sensing elements.

20. The image sensing device of claim 19, wherein the line buffer receives the incoming digital reset values in an array scan ordering, the plurality of encoders are configured to encode the digital reset values stored in the line buffer in a formation that is different from the array scan ordering.

21. The image sensing device of claim 12, wherein the compressed digital reset values include variable bit-length digital values of average bit-length l, the average bit-length l being less than the bit-length of the digital reset value.

22. The image sensing device of claim 12, wherein the image sensing device is a color image sensor, and the LD values are color LD values.

* * * * *